(12) United States Patent
Lee et al.

(10) Patent No.: US 9,748,508 B2
(45) Date of Patent: Aug. 29, 2017

(54) ORGANIC LIGHT EMITTING DIODE AND DISPLAY PANEL USING THE SAME

(71) Applicant: InnoLux Corporation, Miao-Li County (TW)

(72) Inventors: Yu-Hao Lee, Miao-Li County (TW); Wen-Jang Lin, Miao-Li County (TW); Chien-Hsun Huang, Miao-Li County (TW); Shun-Hsi Wang, Miao-Li County (TW); Chien-Ping Chang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 43 days.

(21) Appl. No.: 14/662,605

(22) Filed: Mar. 19, 2015

(65) Prior Publication Data

US 2015/0280165 A1 Oct. 1, 2015

(30) Foreign Application Priority Data

Mar. 26, 2014 (TW) .............................. 103111202 A

(51) Int. Cl.
*H01L 51/52* (2006.01)
*H01L 51/50* (2006.01)
*H01L 51/00* (2006.01)

(52) U.S. Cl.
CPC ...... *H01L 51/5068* (2013.01); *H01L 51/5084* (2013.01); *H01L 51/005* (2013.01); *H01L 51/006* (2013.01); *H01L 51/0052* (2013.01); *H01L 51/0059* (2013.01); *H01L 51/5234* (2013.01)

(58) Field of Classification Search
CPC ......... H01L 51/50; H01L 51/00; H01L 27/32; H01L 51/5088; H01L 51/002; H01L 27/3209; H01L 51/5044
USPC ............................................................ 257/40
See application file for complete search history.

(56) References Cited

U.S. PATENT DOCUMENTS

2014/0183494 A1* 7/2014 Kam ................... H01L 51/5088
257/40

FOREIGN PATENT DOCUMENTS

CN 101027942 8/2007
TW 200952546 A 12/2009

* cited by examiner

*Primary Examiner* — Selim Ahmed
(74) *Attorney, Agent, or Firm* — Bacon & Thomas, PLLC

(57) ABSTRACT

The present invention relates to an organic light emitting diode, comprising: a first electrode; an organic material layer which comprises a hole transport layer, an electron transport layer and an light emitting layer, wherein the hole transport layer may be interposed between the first electrode and the light emitting layer, and the light emitting layer may be interposed between the hole transport layer and the electron transport layer; a second electrode which is disposed on the organic material layer; and a carrier conversion layer which may be interposed between the first electrode and the hole transport layer or between the second electrode and the electron transport layer; wherein the carrier conversion layer has a thickness of 10 nm to 200 nm.

18 Claims, 4 Drawing Sheets

ORGANIC LIGHT EMITTING DIODE AND DISPLAY PANEL USING THE SAME

CROSS REFERENCE TO RELATED APPLICATION

This application claims the benefits of the Taiwan Patent Application Serial Number 103111202, filed on Mar. 26, 2014, the subject matter of which is incorporated herein by reference.

BACKGROUND OF THE INVENTION

1. Field of the Invention

The present invention relates to an organic light-emitting diode and a display panel using the same, and especially to an organic light emitting diode having a carrier conversion layer and a display panel using the same.

2. Description of Related Art

An organic light-emitting diode (OLED) is a self-luminous light-emitting device, having advantages such as a wide viewing angle, high contrast, fast response, and high brightness, etc., and is capable of providing lights with various colors depending on the organic materials used.

The basic structure of a typical organic light emitting diode (OLED) includes a cathode, an organic material layer, and an anode, which are sequentially stacked on a substrate. In an OLED, electrons and holes are injected from the cathode and the anode respectively, and recombine in the organic material layer to emit light. To effectively inject the carriers from the electrode layer to the organic material layer, particularly from the cathode to the organic material layer, the metal with a low work function is generally employed to modify the junction between the cathode and the organic material layer, thereby improving the electron injection efficiency. However, this method may reduce light transmittance of the device, and the carrier injection efficiency is gradually reduced over operation time, thus reducing the service lifetime. In addition, considering the electron injection efficiency, a material with a low work function is generally selected as the electrode, thus limiting the material selection of electrode. In addition, this also increases the difficulty associated with integration of organic light-emitting diodes and other driving circuit elements (such as transistors).

Accordingly, what is needed is to develop an organic light-emitting diode having a long service lifetime, an improved integration ability with other components, and excellent carrier injection efficacy.

SUMMARY OF THE INVENTION

An object of the present invention is to provide an organic light-emitting diode, in which a carrier conversion layer is disposed to thereby improve carrier injection efficiency and service lifetime and allow the device for easy integration with other components.

To achieve the above object, the present invention provides an organic light emitting diode, comprising: a first electrode; an organic material layer which may comprise a hole transport layer, an electron transport layer and an light emitting layer, wherein the hole transport layer may be interposed between the first electrode and the light emitting layer, and the light emitting layer may be interposed between the hole transport layer and the electron transport layer; a second electrode which is disposed on the organic material layer; and a carrier conversion layer which may be interposed between the first electrode and the hole transport layer or between the second electrode and the electron transport layer; wherein the carrier conversion layer may have a thickness of 10 nm to 200 nm. Preferably, in another embodiment, the carrier conversion layer may have a thickness of 30 nm to 200 nm.

In an embodiment, when the carrier conversion layer is interposed between the second electrode and the electron transport layer, the carrier conversion layer may be a P-doped carrier conversion layer.

In another embodiment, when the carrier conversion layer is interposed between the first electrode and the hole transport layer, the carrier conversion layer may be an N-doped carrier conversion layer.

In an embodiment, the material of the P-doped carrier conversion layer may include: N,N'-bis(naphthalen-1-yl)-N, N'-bis(phenyl)-benzidine (NPB), 4,4',4"-tris(N-3-methylphenyl-N-phenylamino)triphenylamine (m-MTDATA), copper(II) phthalocyanine (CuPc), dipyrazino[2,3-f:2',3'-h] quinoxaline-2,3,6,7,10,11-hexacarbonitrile (HATCN), 2,3,5, 6-tetrafluoro-7,7,8,8-tetracyano-quinodimethane (F4-TCNQ), or a combinations of at least two of the above-mentioned materials.

In an embodiment, the material of the N-doped carrier conversion layer comprises: 4,7-diphenyl-1,10-phenanthroline (Bphen), 2,9-dimethyl-4,7-diphenyl-1,10-phenanthroline (BCP), tris(8-hydroxy-quinolinato)aluminium (Alq3), Fullerene (C60), 8-hydroxyquinolinolato-lithium (Liq), or a combinations of at least two of the above-mentioned materials.

In an embodiment, the carrier conversion layer may be in direct contact with the first electrode or the second electrode.

In an embodiment, the carrier conversion layer is interposed between the second electrode and the electron transport layer, and the organic material layer may further include an electron injection layer, which may be interposed between the carrier conversion layer and the electron transport layer.

In an embodiment, the carrier conversion layer is interposed between the second electrode and the electron transport layer, and the organic material layer may further include a hole injection layer, which may be interposed between the first electrode and the hole transport layer.

In an embodiment, the carrier conversion layer is interposed between the second electrode and the electron transport layer, and the second electrode may have a work function of 4.2 eV to 5.5 eV.

In an embodiment, when the carrier conversion layer is interposed between the second electrode and the electron transport layer, the second electrode may be a transparent conductive oxide layer. Specifically, in another embodiment, the first electrode may also a transparent conductive oxide layer.

Furthermore, the present invention further provides a display panel, comprising: a substrate; and the above-described organic light-emitting diode which may be disposed on the substrate. Depending on the type of the organic the light-emitting diode, the substrate may be a transparent substrate (for example: a glass substrate, and a plastic substrate) or an opaque substrate, but the present invention is not particularly limited thereto.

Accordingly, the organic light-emitting diode with the carrier conversion layer of the present invention may be employed to prepare a display panel which has long service lifetime and is easy to be prepared.

DETAILED DESCRIPTION OF THE PREFERRED EMBODIMENT

Figure 1:
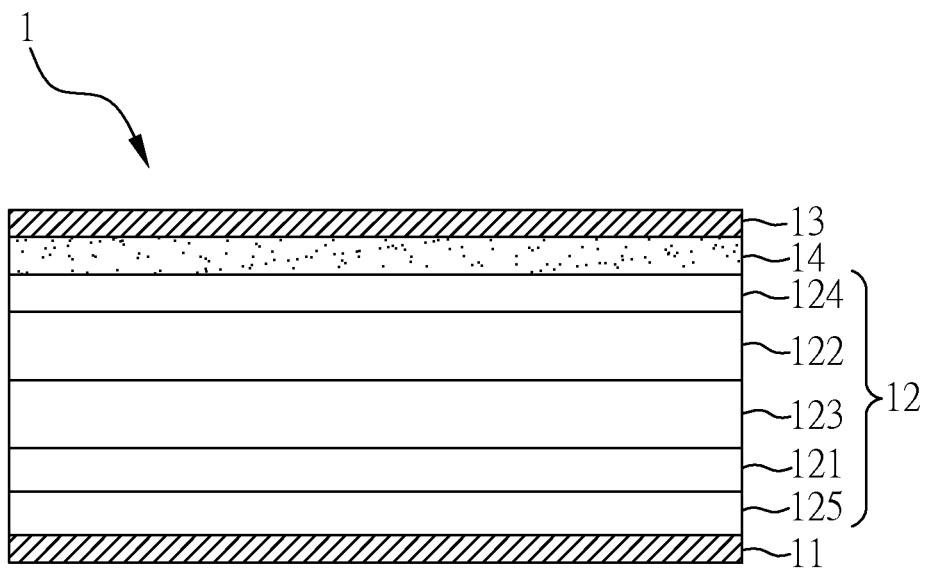
FIG. 1 shows a schematic structure of the organic light-emitting diode 1 according to Example 1 of the present invention.

Conventionally, in order to improve the charge injection efficiency from the electrode, the cathode is generally modified by low work function metal or its alloy at the interface with the organic material layer. However, this approach often leads to deterioration of the electrode, thereby shortening the service lifetime. Moreover, it is difficult to integrate organic light-emitting diodes with other components (such as driver circuits) by following this approach. Therefore, to address the above issues without compromising the luminous efficiency, a P-doped or N-doped carrier conversion layer is disposed between the electrodes and the organic material layer to provide the organic light emitting diode with a PINP or NPIN structure. Specifically, by disposing this carrier conversion layer, the electrode of organic light-emitting diodes of the invention is no longer confined to the conventional, specific electrode materials. For example, there is no need to select a low work function material as the cathode or use the low work function material to modify the cathode at the interface with the organic material. Meanwhile, since the electrode materials of organic light-emitting diodes of the present invention is no more limited by the conventional materials, the invention hereby imparts more flexibility to the skilled person to choose suitable electrode materials to facilitate the integration with other components. As such, the aforementioned integration problem can be solved.

More preferably, unlike conventional approach, a high work function material can be employed as a cathode of the organic light-emitting diode of the invention to improve the service lifetime and solve the integration issue. Furthermore, depending on the type of organic light emitting diodes, the skilled person may select a transparent conductive oxide with a high work function (e.g., indium tin oxide (ITO), indium zinc oxide (IZO), etc.) or a metal having a high work function as the first electrode or the second electrode to provide a top emission, bottom emission, or transparent OLED.

In other words, unlike conventional approach, a low work function material is not required in the present invention. Furthermore, the material of the carrier conversion layer is not particularly limited, as long as it can improve organic light-emitting diode carrier injection efficiency and solve the integration problem. Preferably, as described above, according to the position of the carrier conversion layer, it may be a P-doped layer or an N-doped layer. More preferably, the P-doped or N-doped material may be consisted of organic materials only. In other words, the effect of the charge transfer can be achieved without using low work function materials together with organic materials, which is generally used in the conventional approach. Specifically, in the embodiment of the invention, the carrier conversion layer can use a P-doped hole transport layer or an N-doped electron transport layer to achieve the charge transfer effect.

In the present invention, since the a high work function material can be advantageously used as the electrode material and its interface with the organic material layer needs no modification, the phrase "the carrier conversion layer is in direct contact with the first electrode or the second electrode" means that the carrier conversion layer is in direct contact with an electrode material having a high work function without any layer or material disposed therebetween.

In addition, the organic material layer of organic light-emitting diodes is not particularly limited, as long as it can be used to fabricate an organic light emitting device. Similarly, without departing from the spirit of the invention, the structures of the organic light-emitting diodes can be modified if it is needed. In addition, the preparation methods of the above described layers may be properly selected based on the types of the organic light-emitting diode, the functional layers of the organic light-emitting diode, and so forth.

Therefore, since the organic light-emitting diode of the invention has a carrier conversion layer made of an organic material, those skilled in the art may advantageously use a high work function material as an electrode to facilitate the integration with other components and at the same time, improve carrier injection efficiency and service lifetime.

The present invention will now be explained in further detail with reference to the following examples. However, these examples are merely illustrative of the present invention, the scope of which shall not be construed to be limited by the following examples.

Example 1

FIG. 1 shows a schematic structural view of an embodiment of the organic light emitting diode, comprising: a first electrode 11; an organic material layer 12, which includes a hole transport layer 121, an electron transport layer 122, and a light-light emitting layer 123, wherein the hole transport layer 121 is interposed between the first electrode 11 and the light-light emitting layer 123, the light emitting layer 123 is interposed between the hole transport layer 121 and the electron transport layer 122; a second electrode 13 provided on the organic material layer 12; a carrier conversion layer 14 interposed between the second electrode 13 and the electron transport layer 122; wherein the carrier conversion layer 14 is a P-doped carrier conversion layer having a thickness of 55 nm. In addition, to further improve the injection efficiency of electrons from the carrier conversion layer 14 to the electron transport layer 122, and injection efficiency of holes from the first electrode 11 to the hole transport layer 121, the organic material 12 of the organic light emitting diode of Example 1 further comprises an electron injection layer 124 provided between the carrier conversion layer 14 and the electron transport layer 122 and a hole injection layer 125 provided between the first electrode 11 and the hole injection layer 125.

In Example 1, the first electrode 11 is a transparent conductive oxide layer composed of ITO, and the second electrode 13 is a transparent conductive oxide layer composed of IZO. In Example 1, the hole transport layer 121, the electron transport layer 122, the light emitting layer 123, the electron injection layer 124, and the hole injection layer 125 of the organic material layer 12 may be each independently selected from conventional materials, the this invention is not particularly limited. As for the carrier conversion layer 14, it can be formed of a mixture of a hole transport material (e.g., NPB or m-MTDATA) and a P-doped material (e.g., F4-TCNQ). In Example 1, the total thickness of the hole transport layer 121, and the hole injection layer 125 is 135 nm.

In Example 1, each functional layer of the organic light emitting diode 1 may be prepared using conventional methods, and will not be described in detail here. The person skilled in the art can select appropriate preparation methods based on the material and adjust the process parameters according to practical requirements, and the present invention is not particularly limited.

As such, a top-emission organic light-emitting diode 1 with the carrier conversion layer was prepared in Example 1.

Example 2

Example 2 was substantially similar to Example 1, except that the total thickness of the hole injection layer and the hole transport layer in Example 2 was 35 nm, while the carrier conversion layer had a thickness of 20 nm.

Examples 3-5

Examples 3-5 were substantially similar to Example 2, except for the thickness of the carrier conversion layer, wherein the carrier conversion layer had a thickness of 60 nm in Example 3, 80 nm in Example 4, and 100 nm in Example 5. Accordingly, the organic light-emitting diodes having different carrier conversion layer thicknesses could be prepared.

Examples 6-7

Examples 6 and 7 were substantially similar to Example 2, except that the second electrode in Example 6 was made of silver (Ag), and the second electrode in Example 7 was made of aluminum (Al).

Examples 8-10

Examples 8-10 were substantially similar to Example 2, Example 6 and Example 7, respectively, except that the interface between the second electrode and organic material layer of the organic light emitting diode of the present examples was modified by a low work function material. Specifically, the second electrode in Example 8 was made of MgAg/IZO, the second electrode in Example 9 was made of MgAg/Ag, and the second electrode in Example 10 was made of LiF/Al.

Example 11

Figure 2:
FIG. 2 shows a schematic structure of the organic light-emitting diode 2 according to Example 11 of the present invention.

FIG. 2 shows a schematic structure of the organic light-emitting diode 2 according to Example 11 of the present invention, comprising: a first electrode 21; an organic material layer 22 including a hole transport layer 221, an electron transport layer 222, and a light emitting layer 223, wherein the hole transport layer 221 is interposed between the first electrode 21 and the light emitting layer 223, and the light emitting layer 223 is interposed between the hole transport layer 221 and the electron transport layer 222; a second electrode 23 disposed on the organic material layer 22; and a carrier conversion layer 24 interposed between the first electrode 21 and the hole transport layer 221; wherein the carrier conversion layer 24 is the N-type doping carrier conversion layer. As such, a top-emission organic light-emitting diode 2 with the N-type doping carrier conversion layer was prepared in Example 11.

Example 12

Figure 3:
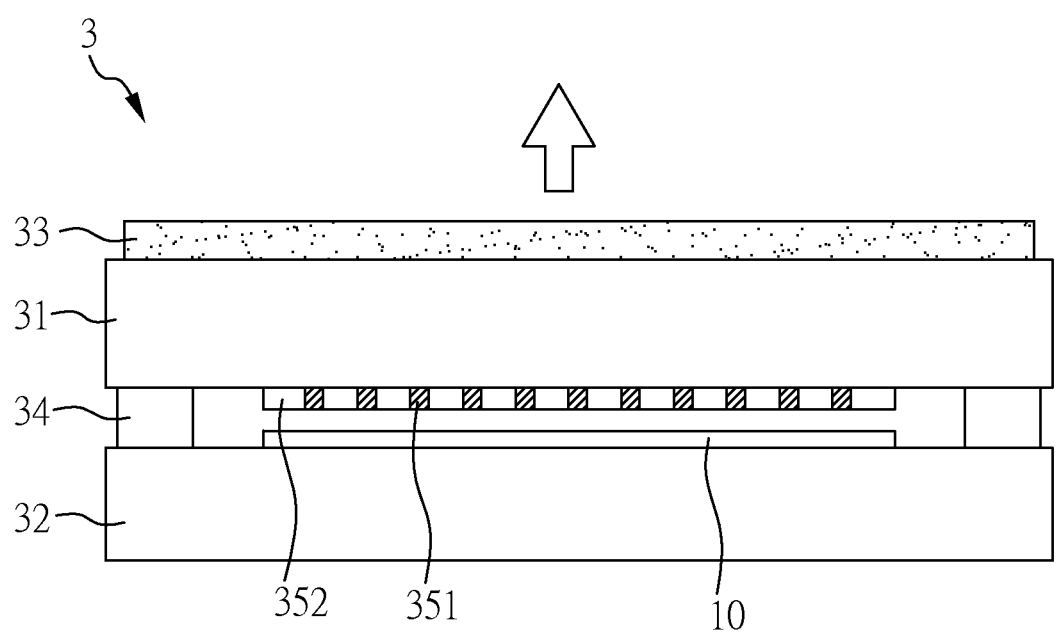
FIG. 3 shows a schematic structure of the display panel 3 according to Example 12 of the present invention.

FIG. 3 shows a schematic structure of the display panel 3 according to Example 12. As shown in FIG. 3, the display panel in this Example 12 includes a substrate 32; and an organic light emitting diode 10 disposed on the substrate 32.

In this Example 12, the organic light-emitting diode 10 may be the organic light-emitting diode described in Example 1 or 11, and will be not repeated herein. Both the organic light-emitting diodes described in Examples 1 and 11 are the top-emission organic light-emitting diode, which are disposed on the substrate 32 with its non-light-emitting side, that is, with the first electrode abutting on the substrate 32. Furthermore, the display panel 3 of this Example further comprises: a light-transmitting substrate 31, a plurality of spacers 351, a plurality of color filters 352, and a seal element 34. The spacer 351 is disposed between two adjacent color filters 352, in order to prevent interference between the lights emitted through the color filters 352. The organic light emitting diode 10 is disposed between the light-transmitting substrate 31 and the substrate 32, and sealed by the seal element 34. Here, the white OLED is taken as an example, and in other embodiments, the OLED may be red, green, or blue OLED without the need of color filters 352. In addition, the above-described spacer 351 may be a conventional black matrix which is commonly used in the art.

Further, in the light emitting side of the display of the panel, namely, on the opposite side of the transparent substrate 31 with respect to the side where the spacer 351 and the color filter 352 are disposed, a polarizing element 33 may be optionally provided to reduce reflection of ambient light and increase the contrast. Nevertheless, the polarizing element 33 may be omitted from the display panel 3 of Example 13.

Comparative Example 1

Comparative Example 1 was substantially similar to Example 1, except that the carrier conversion layer 14 was replaced by a metal layer having a low work function in Comparative Example 1. In other words, the organic light-emitting diode of Comparative Example 1 was a conventional organic light-emitting diode, which employed the metal layer having a low work function to improve the electron injection from the cathode to the electron transport layer.

Comparative Example 2

Comparative Example 2 was substantially similar to Example 2, except that the carrier conversion layer was replaced by a metal layer having a low work function in Comparative Example 2. In other words, the organic light-emitting diode of Comparative Example 2 was also a conventional organic light-emitting diode, which employed the metal layer having a low work function to improve the electron injection from the cathode to the electron transport layer.

Test Example 1

Table 1 shows the test results of the organic light-emitting diodes efficiency of Example 1 and Comparative Example 1.

As shown in Table 1, under the same current density, the luminous efficiency and power efficiency of Example 1 were both higher than those of Comparative Example 1. In addition, the comparison results of T90 (the time required for a brightness attenuation from the initial transmittance to 90% thereof) and T80 (the time required for a brightness attenuation from the initial transmittance to 80% thereof) indicates that the attenuation time required for Example 1 was about three times longer than that for Comparative Example 1. Therefore, the test results in Table 1 shows that the organic light-emitting diode of Example 1 had a longer service lifetime and better performance compared to that of Comparative Example 1.

TABLE 1

| | Voltage (V) | brightness (cd/m²) | current density (mA/cm²) | luminous efficiency (cd/A) | power efficiency (lm/A) | T90 (%) | T80 (%) |
|---|---|---|---|---|---|---|---|
| Comparative Example 1 | 4.10 | 363.03 | 10 | 3.63 | 2.82 | 100 | 100 |
| Example 1 | 4.25 | 548.27 | 10 | 5.48 | 4.05 | 310 | 350 |

Test Example 2

Figure 4:
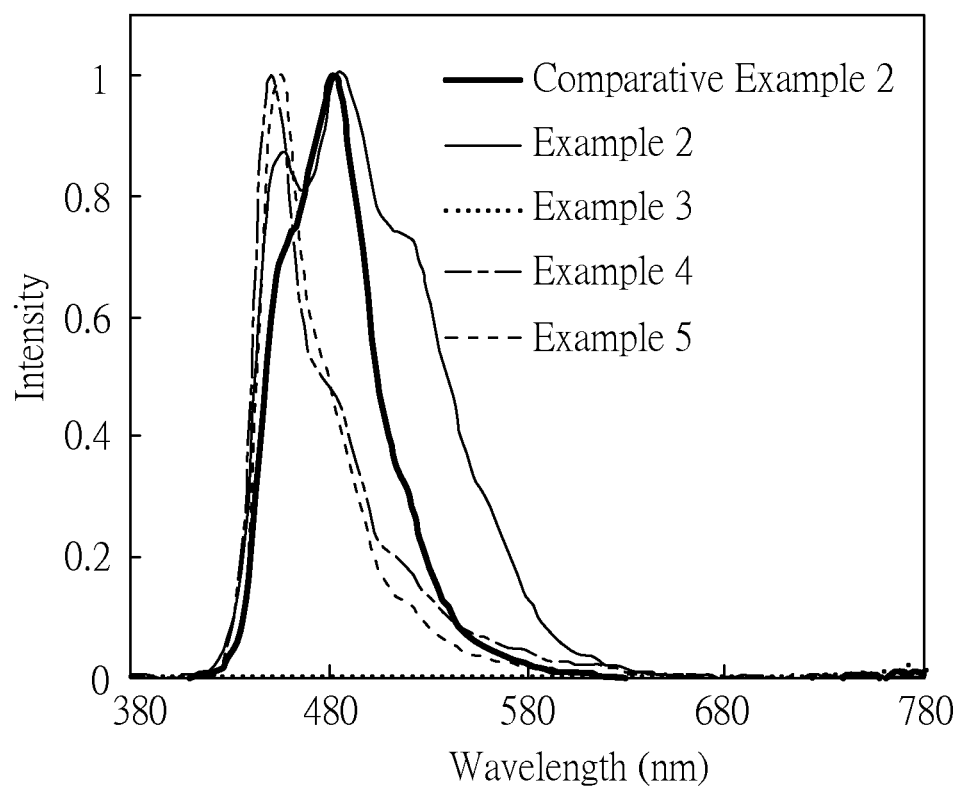
FIG. 4 shows a spectrum of the results according to Test Example 2 of the present invention.

Table 2 shows the test results of the organic light-emitting diodes efficiency of Examples 2-5 and Comparative Example 2. It can be seen from Table 2 that with increase in thickness of the carrier conversion layer, the performance (brightness, luminous efficiency, and power efficiency) of the organic light-emitting diodes according to the present invention, was not significantly affected. Then, referring to Table 2 incorporated by FIG. 4 showing the spectrum corresponding to Table 2, with increase in thickness of the carrier conversion layer, blue shift phenomenon occurred in wavelength of the light emitted by the organic light emitting diode of each Example. This indicates that the thickness of the carrier conversion layer according to the present invention can be used to regulate the light colors of the prepared organic light-emitting diodes, and the wide range of adjustable thickness increases the process tolerance, thereby improving the overall thickness uniformity.

TABLE 2

| | Voltage (V) | brightness (cd/m²) | current density (mA/cm²) | luminous efficiency (cd/A) | power efficiency (lm/A) | CIE x | CIE y |
|---|---|---|---|---|---|---|---|
| Comparative Example 2 | 3.82 | 668.1 | 10 | 6.68 | 5.50 | 0.141 | 0.176 |
| Example 2 | 4.09 | 745.3 | 10 | 7.45 | 5.72 | 0.148 | 0.236 |
| Example 3 | 4.17 | 652.2 | 10 | 6.52 | 4.91 | 0.154 | 0.212 |
| Example 4 | 4.31 | 567.8 | 10 | 5.68 | 4.14 | 0.151 | 0.188 |
| Example 5 | 4.32 | 507.5 | 10 | 5.08 | 3.69 | 0.148 | 0.174 |

Test Example 3

Figure 5:
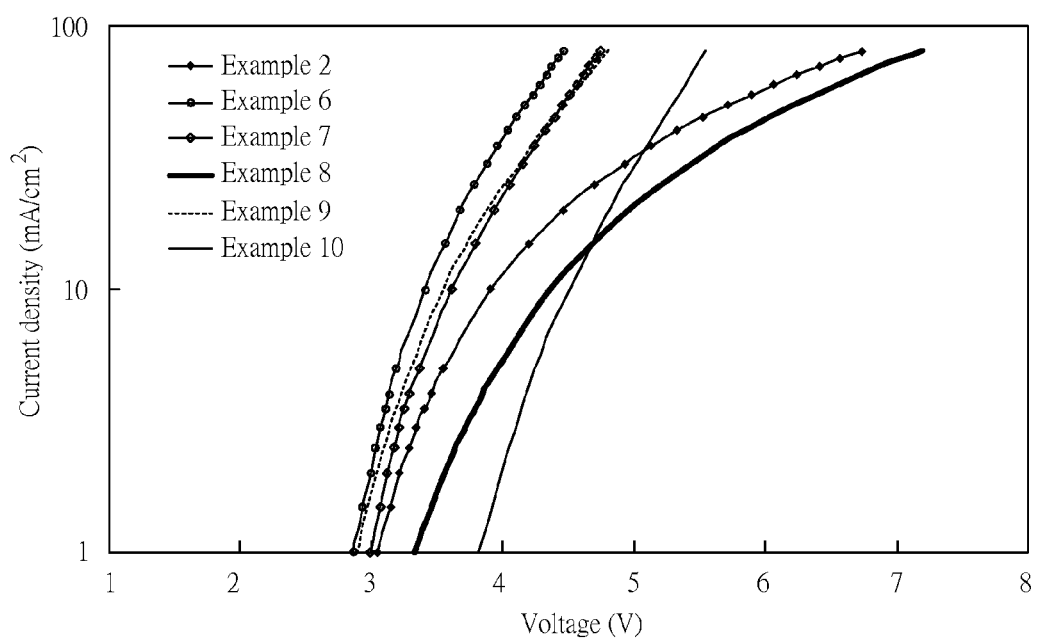
FIG. 5 shows a schematic diagram of the current density according to Test Example 3 of the present invention.

FIG. 5 shows a schematic diagram of voltage-current density of the organic light-emitting diodes according to Examples 2 and 6-10. As shown in FIG. 5, various electrode materials may be used as the second electrode of the organic light emitting diode in the present invention, and under the same current density and with the same electrode material (silver, aluminum, or IZO), the organic light-emitting diodes of Examples 2, 6 and 7 had a lower voltage compared to that of Examples 8-10, respectively. This indicates that the organic the light-emitting diodes with the second electrode without being modified by the low work function material (MgAg or LiF) had a lower driving voltage. Accordingly, it can been seen from the results of Test Example 3 that, when the carrier conversion layer was interposed between the second electrode and the organic material layer, the person skilled in the art can select appropriate electrode materials to meet the design demand of the device. Preferably, the electrode materials without being modified by the a low work function material may be selected to thereby prepare an organic light emitting having an excellent carrier injection efficiency and improved service lifetime, and allow the device for easy integration with other components.

Although the present invention has been explained in relation to its preferred embodiment, it is to be understood that many other possible modifications and variations can be made without departing from the spirit and scope of the invention as hereinafter claimed.

What is claimed is:
1. An organic light emitting diode, comprising:
   a first electrode;
   an organic material layer which comprises a hole transport layer, an electron transport layer and an light emitting layer, wherein the hole transport layer is interposed between the first electrode and the light emitting layer, and the light emitting layer is interposed between the hole transport layer and the electron transport layer;
   a second electrode disposed on the organic material layer; and
   a carrier conversion layer interposed between the first electrode and the hole transport layer or between the second electrode and the electron transport layer;
   wherein the carrier conversion layer has a thickness of 10 nm to 200 nm.
2. The organic light emitting diode of claim 1, wherein the carrier conversion layer is interposed between the second electrode and the electron transport layer, and the carrier conversion layer is a P-doped carrier conversion layer.
3. The organic light emitting diode of claim 1, wherein the carrier conversion layer is interposed between the first electrode and the hole transport layer, and the carrier conversion layer is an N-doped carrier conversion layer.
4. The organic light emitting diode of claim 2, wherein a material of the P-doped carrier conversion layer comprises: N,N'-bis(naphthalen-1-yl)-N,N'-bis(phenyl)-benzidine (NPB), 4,4',4''-tris(N-3-methylphenyl-N-phenylamino)triphenylamine (m-MTDATA), copper(II) phthalocyanine (CuPc), dipyrazino[2,3-f:2',3'-h]quinoxaline-2,3,6,7,10,11-hexacarbonitrile (HATCN), 2,3,5,6-tetrafluoro-7,7,8,8-tetracyano-quinodimethane (F4-TCNQ), or a combination of at least two of the above materials.
5. The organic light emitting diode of claim 3, wherein a material of the N-doped carrier conversion layer comprises: 4,7-diphenyl-1,10-phenanthroline (Bphen), 2,9-dimethyl-4,7-diphenyl-1,10-phenanthroline (BCP), tris(8-hydroxy-quinolinato)aluminium (Alq3), Fullerene (C60), 8-hydroxyquinolinolato-lithium (Liq), or a combination of at least two of the above materials.
6. The organic light emitting diode of claim 1, wherein the carrier conversion layer is in direct contact with the first electrode or the second electrode.
7. The organic light emitting diode of claim 1, wherein the carrier conversion layer has a thickness of 30 nm to 200 nm.

8. The organic light emitting diode of claim 2, wherein the second electrode has a work function of 4.2 eV to 5.5 eV.

9. The organic light emitting diode of claim 2, wherein the second electrode is a transparent conductive oxide layer.

10. A display panel, comprising:
 a substrate; and
 an organic light emitting diode disposed on the substrate, comprising:
  a first electrode;
  an organic material layer which comprises a hole transport layer, an electron transport layer and an light emitting layer, wherein the hole transport layer is interposed between the first electrode and the light emitting layer, and the light emitting layer is interposed between the hole transport layer and the electron transport layer;
  a second electrode disposed on the organic material layer; and
  a carrier conversion layer interposed between the first electrode and the hole transport layer or between the second electrode and the electron transport layer;
  wherein the carrier conversion layer has a thickness of 10 nm to 200 nm.

11. The display panel of claim 10, wherein the carrier conversion layer is interposed between the second electrode and the electron transport layer, and the carrier conversion layer is a P-doped carrier conversion layer.

12. The display panel of claim 10, wherein the carrier conversion layer is interposed between the first electrode and the hole transport layer, and the carrier conversion layer is an N-doped carrier conversion layer.

13. The display panel of claim 11, wherein a material of the P-doped carrier conversion layer comprises: N,N'-bis(naphthalen-1-yl)-N,N'-bis(phenyl)-benzidine (NPB), 4,4',4''-tris(N-3-methylphenyl-N-phenylamino)triphenylamine (m-MTDATA), copper(II) phthalocyanine (CuPc), dipyrazino[2,3-f:2',3'-h]quinoxaline-2,3,6,7,10,11-hexacarbonitrile (HATCN), 2,3,5,6-tetrafluoro-7,7,8,8-tetracyanoquinodimethane (F4-TCNQ), or a combination of at least two of the above materials.

14. The display panel of claim 12, wherein a material of the N-doped carrier conversion layer comprises: 4,7-diphenyl-1,10-phenanthroline (Bphen), 2,9-dimethyl-4,7-diphenyl-1,10-phenanthroline (BCP), tris(8-hydroxy-quinolinato) aluminium (Alq3), Fullerene (C60), 8-hydroxyquinolinolato-lithium (Liq), or a combination of at least two of the above materials.

15. The display panel of claim 10, wherein the carrier conversion layer is in direct contact with the first electrode or the second electrode.

16. The display panel of claim 10, wherein the carrier conversion layer has a thickness of 30 nm to 200 nm.

17. The display panel of claim 11, wherein the second electrode has a work function of 4.2 eV to 5.5 eV.

18. The display panel of claim 11, wherein the second electrode is a transparent conductive oxide layer.

* * * * *